United States Patent [19]

Skanadore

[11] 4,296,336
[45] Oct. 20, 1981

[54] SWITCHING CIRCUIT AND METHOD FOR AVOIDING SECONDARY BREAKDOWN

[75] Inventor: William R. Skanadore, Tempe, Ariz.

[73] Assignee: General Semiconductor Co., Inc., Del.

[21] Appl. No.: 5,157

[22] Filed: Jan. 22, 1979

[51] Int. Cl.³ .............. H03K 17/10; H03K 17/64; H01L 29/72
[52] U.S. Cl. .............. 307/300; 307/253; 307/302; 357/13; 357/34; 357/36
[58] Field of Search .............. 307/246, 253, 254, 300, 307/302, 280; 357/13, 20, 34, 36, 46, 51, 89

[56] References Cited

U.S. PATENT DOCUMENTS

| | | | |
|---|---|---|---|
| 3,271,201 | 9/1966 | Pomerantz | 357/34 |
| 3,358,197 | 12/1967 | Scarlett | 357/34 |
| 3,400,310 | 9/1968 | Dorendorf et al. | 357/34 |
| 3,418,495 | 12/1968 | Bose | 307/239 |
| 3,444,443 | 5/1969 | Moroshima | 357/34 |
| 3,546,492 | 12/1970 | Barchok | 307/300 |
| 3,614,553 | 10/1971 | Franklin et al. | 357/34 |
| 3,628,047 | 12/1971 | Cronin et al. | 307/246 |
| 3,736,495 | 5/1973 | Calkin et al. | 307/297 |
| 3,936,863 | 2/1976 | Ohmstead | 357/36 |
| 4,123,670 | 10/1978 | Pollmeier | 307/300 |
| 4,157,561 | 6/1979 | Nawata et al. | 357/34 |
| 4,239,989 | 12/1980 | Brajder | 307/300 |

FOREIGN PATENT DOCUMENTS 1051122  3/1979  Canada .............. 357/34

OTHER PUBLICATIONS

RCA Power Transistors, RCA Technical Series PM-81 (RCA, Somerville, N. J., 1971), pp. 38–43 (Exr's personal copy).
Beatty et al., "Second Breakdown in Power Transistors . . . ", IEEE Transactions on Electron Devices, vol. ED-23, No. 8, Aug. 1976, pp. 851–857.
Gillett, "Power Transistor Having Increased Reverse Bias Safe Operating Area", IBM Technical Disclosure Bulletin, vol. 16, No. 11, Apr. 1974, p. 3642, (357-36).
Wang, "Power Transistor with Reverse-Biased Second Breakdown Capability", IBM Technical Disclosure Bulletin, vol. 19, No. 2, Jul. 1976, pp. 551–552 (357-34).

*Primary Examiner*—William D. Larkins
*Attorney, Agent, or Firm*—Cahill, Sutton & Thomas

[57] ABSTRACT

A switching circuit includes a transistor having a base, collector, and emitter terminals, a load device connected to the collector terminal and a supply voltage, and circuitry connected to the base terminal for conducting a turn-off current out of the base terminal. The transistor has an emitter bonding pad which extends from the edge of the emitter region over the collector. A region of the same conductivity type as the base region of the transistor and spaced from the base region is disposed in the collector region and contacts the emitter bonding pad. Charge is drawn out of the base region of the transistor at a rate sufficient to reverse bias the entire emitter-base junction before the collector attains the minimum secondary breakdown voltage level of the transistor. The geometry of the transistor is such that the maximum distance between the base contact region and any point of the emitter is sufficiently small to prevent the degree of constriction of emitter current which will cause the critical electrical field of the collector region to be exceeded. The rate of increasing the voltage of the collector beyond the secondary breakdown level of the transistor leading to base width modulation does not cause forward biasing of any portion of the emitter-base junction after the collector voltage exceeds the secondary breakdown voltage level of the transistor.

1 Claim, 15 Drawing Figures

SWITCHING CIRCUIT AND METHOD FOR AVOIDING SECONDARY BREAKDOWN

BACKGROUND OF THE INVENTION

1. Field of the Invention

The invention relates to transistor switching circuits capable of safe operation at collector voltages in excess of the secondary breakdown voltage level of transistors contained in the transistor switching circuits.

2. Description of the Prior Art

Various high voltage breakdown phenomena are known to occur in transistors. High voltage breakdown can cause distruction of transistors operating in high voltage switching circuits, thereby causing circuit malfunctions in electronic systems containing the high voltage switching circuits. A number of high voltage breakdown parameters of transistors, including the open base collector-to-emitter breakdown voltage ($BV_{CEO}$), the base shorted collector-to-emitter breakdown voltage ($BV_{CES}$) and the punch through voltage ($V_{PT}$) are well known and have been widely described in the literature.

It is also well known that transistors experience a phenomena referred to as secondary breakdown. Secondary breakdown occurs at collector voltages which are lower than the above mentioned high voltage breakdown parameters, but the actual collector voltage at which secondary breakdown occurs depends upon the operating conditions of the transistor as well as the physical parameters of the transistor. Power transistors are frequently characterized in their written product specifications by "safe operating area" (SOA) characteristics. The SOA characteristic for a particular transistor can be experimentally derived and constitutes the locus of points (for a given set of operating conditions) within which it can be guaranteed that the transistor will not go into secondary breakdown during a turn-off operation switching the transistor from an "on" condition to an "off" condition. Thus, the SOA curve (or curves) for a transistor shown the highest permissible collector voltages of that transistor during its operation in a switching circuit. Secondary breakdown has been widely discussed in the literature, although the mechanisms involved are not yet completely understood. See for example: "Avalanche Injection and Second Breakdown in Transistors", by Phillip L. Hower & V. G. K. Reddi, *IEEE Transactions on Electron Devices*, Vol. ED-17, No. 4, April, 1970; "Second Breakdown in Power Transistors Due to Avalanche Injection", by Brent A. Beatty, Surinder Krishna, Michael Adlar, *IEEE Transactions on Electron Devices, Vol. ED-*23, No. 8, August, 1976; "Power Transistor Crystal Damage in Inductive Load switching": A Reliability Concern", by F. P. Gaur, G. Lowe, W. Thorpe, *Proceedings of 1977 International Reliability Physics Symposium*, Las Vegas, Nev., Apr. 12, 1977; "Second Breakdown of Transistors during Inductive Turn-off", by S. Krishna, P. L. Hower, *Proceedings of IEEE, Letters*, March, 1973, p. 393-395; "Load Line Shaping Considerations for the High Speed Switching Transistor", by W. R. Skanadore, *Proceedings of Powercon* 4, May, 1977; U.S. Pat. Nos.: 3,418,495 to Bose; 3,736,495 to Calkin et al.; 3,628,047 to Cronin et al.

High voltage power switching transistors having $BV_{CBO}$ characteristics up to approximately 450 volts are readily commercially available. However, for power transistors of a particular power dissipation and current handling capability, cost increases sharply as the $BV_{CEO}$ voltage level increases. Further, power transistors having high $BV_{CEO}$ levels have undesirable corresponding characteristics, such as high saturation voltages.

As mentioned above, the secondary breakdown voltage level ordinarily is substantially less than $BV_{CEO}$ for a particular transistor of the type under discussion. However, if it can be assured that the transistor will not go into secondary breakdown during its operation, then $BV_{CBO}$, rather than the secondary breakdown voltage or $BV_{CEO}$ represents the highest voltage which may occur on the collector of a transistor during its operation as a "switch" (which herein means that the transistor is turned on and off during its operation).

In this case, a circuit designer can utilize $BV_{CEO}$ specifications rather than SOA curves to select a suitable power transistor for such applications. Unfortunately, circuit designers have found it very difficult to reliably avoid secondary breakdown in high power transistors operated as switches. Consequently, circuit designers ordinarily select switching power transistors having a minimum secondary breakdown voltage level which exceeds any expected collector voltage during operation of the transistor in the particular application, since if secondary breakkown does occur in the transistor, it will usually be destroyed. It should be noted that a power transistor having a minimum secondary breakdown voltage level is ordinarily substantially less expensive than one having that voltage level as its $BV_{CEO}$ or $BV_{CBO}$ level.

Power transistors ordinarily have an emitter region having a relatively large rectangular region and a number of elongated fingers. A metal layer having a number of corresponding elongated fingers contacts the fingers of the emitter region and also includes a relatively large rectangular emitter bonding pad which lies over and is in electrical contact with the rectangular portion of the emitter. It is well known that a high ratio of peripheral emitter length to emitter area is desirable for power transistors. However, a finger-like structure would be unfeasible beneath the emitter bonding pad, so a rectangular portion of the emitter is used beneath the emitter bonding pad.

Accordingly, it is an object of the invention to provide transistor circuitry which avoids occurrence of secondary breakdown for collector voltages greater than the secondary breakdown voltage level of transistors contained in the switching circuits.

Another object of the invention is to provide a method of operating transistors in switching circuits to avoid secondary breakdown while the collector voltages of the transistors exceed the secondary breakdown voltage levels of the transistors.

It is another object of the invention to provide an improved transistor having a structure which makes the transistor less susceptible to secondary breakdown than previous transistor structures.

It is yet another object of the invention to provide a power transistor structure which is less prone to secondary breakdown and is readily manufacturable utilizing conventional transistor manufacturing techniques.

SUMMARY OF THE INVENTION

Briefly described, and in accordance with one embodiment thereof, the invention provides a switching circuit and method for avoiding secondary breakdown in a transistor wherein the collector voltage of the transistor exceeds the secondary breakdown voltage of the transistor during the operation of turning the transistor off. The switching circuit includes a load device connected between the collector of the transistor and a supply voltage conductor for conducting a voltage which permits the collector voltage to exceed the secondary breakdown level of the switching transistor. The emitter of the switching transistor is connected to a ground conductor. A turn-on circuit is connected to the base terminal of the switching transistor to provide a turn-on base current sufficient to saturate or nearly saturate the switching transistor in the described embodiment of the invention, wherein the switching transistor is an NPN transistor. A turn-off circuit is connected to the base terminal of the switching transistor to draw a base turn-off current out of the base terminal of the switching transistor. The base turn-off current is of sufficient magnitude to discharge enough stored charge in the base and collector regions of the switching transistor to reverse bias the entire emitter base junction before the collector voltage begins to rise rapidly. After the collector voltage begins to rise rapidly the base turn-off current is sufficiently large to remove enough depletion charge created as the collector voltage of the transistor increases to prevent any portion of the emitter base junction from again becoming forward biased. The switching transistor includes an emitter region having a plurality of fingers which are interdigitated with fingers of the base contact region of the switching transistor. The switching transistor includes a layer of emitter metal including interdigitated fingers which correspondingly contact the fingers of the emitter region and also includes an emitter bonding pad which extends laterally away from the emitter region and base region. In one embodiment of the invention, a second region of the same conductivity type as the base region and spaced from the base region is diposed beneath the emitter bonding pad and is contacted by the emitter bonding pad. In another embodiment of the invention, oxide insulates the collector region from the emitter bonding pad. The turn-off circuit is operated so that the turn-off base current is withdrawn at a sufficient rate to discharge enough of the holes stored in the base and collector regions to reverse bias the entire emitter-base junction. The structure of the switching transistor avoids a sufficiently high degree of emitter current constriction otherwise necessary to cause secondary breakdown beneath the emitter bonding pad by eliminating the portion of the emitter extending beneath the emitter bonding pad in prior art power transistor structures.

DESCRIPTION OF THE INVENTION

Figure 1:
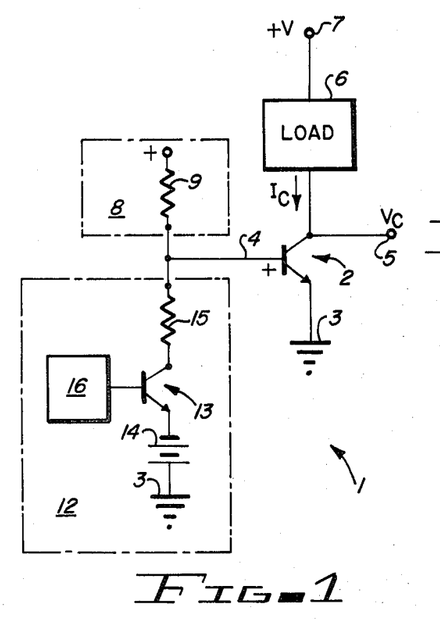
FIG. 1 is a schematic diagram of one embodiment of the invention.
Figure 1A:
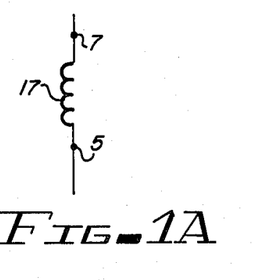
FIG. 1A illustrates a load device which can be used in the circuit of FIG. 1.
Figure 1B:
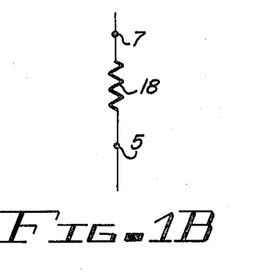
FIG. 1B illustrates another load device which can be used in the circuit of FIG. 1.

Referring now to FIG. 1, a power transistor output circuit 1 includes a switching transistor 2 having its emitter terminal connected to a ground conductor 3 and its collector terminal 5 connected to one terminal of a load device 6, which has its opposite terminal connected to a high voltage conductor 7. Load device 6 can be implemented by inductor 17 of FIG. 1A or resistor 18 of FIG. 1B. It should be noted that the voltage $+V$ conducted by high voltage supply conductor 7 exceeds the minimum secondary breakdown voltage level of transistor 2 if the load device is a resistor. (Of course, if the load device is an inductor, the collector voltage may exceed the secondary breakdown voltage level even if $+V$ is less than the secondary breakdown voltage level of the transistor.)

The base terminal or electrode of switching transistor 2 is connected to conductor 4, which is connected to a "turn-on" circuit 8 and a "turn-off" circuit 12. Turn-on circuit 8 can include any suitable type of circuitry which supplies an input base current into the base terminal of transistor 2. For example, resistor 9, connected to a suitable positive supply voltage, can readily perform this function. Of course, many other types of turn-on circuitry readily could be utilized by those skilled in the art.

Turn-off circuitry 12 includes a transistor 13 having its base connected to a control circuit 16. Control circuitry can be any circuit capable of controllably turning transistor 13 on and off and will not be described in detail, since numerous suitable circuits can readily be provided by those skilled in the art. The collector of transistor 13 is connected to conductor 4; resistor 15 represents the lumped collector resistance of transistor 13. The emitter of transistor 13 is connected to the negative terminal of a voltage source 14, the positive terminal of which is connected to ground conductor 3. The value of resistor 15 is selected to draw a suitable turn-off current out of the base terminal of transistor 2 when transistor 13 is turned on so as to avoid occurrence of second breakdown in transistor 2 during turning off of transistor 2, as subsequently explained in detail.

As previously mentioned, the phenomena which mainly determines the reliable limits of collector voltage and collector current is the secondary breakdown, which can cause destruction of a transistor. The secondary breakdown voltage of a particular transistor depends upon not only the transistor parameters, but also upon the mode of operation of the transistor. It is therefore difficult to illustrate the secondary breakdown voltage characteristic of a transistor for all operating modes of the transistor. In the present patent application, the term "secondary breakdown" voltage is used to describe the collector voltage at which a portion of the collector region of the transistor can no longer support or withstand a critical electric field (designated $E_{cr}$ in the drawings) which has been brought about by "current crowding" beneath a portion of the emitter region of the transistor. The current crowding in turn is brought about by the application of a base "turn-off" current which, as subsequently explained, causes the emitter current to be restricted to or crowded into a reduced area beneath the emitter region because of variations of the emitter-base bias voltage along the emitter base junction of the transistor. Such variations in emitter-base bias voltage are caused by lateral voltage drops in the base region along the emitter-base junction due to the resistive voltage drop caused by flow of the above mentioned base turn-off current. The variations in emitter-base bias voltage cause minority carriers in the base region which are being injected from the emitter into the base region to be "crowded" into the above mentioned reduced areas beneath the emitter. This increases the emitter current density in the crowded area. One result of such increasing of emitter current density is a self-perpetuating localized reduction of the base-emitter voltage ($V_{BE}$), which can further increase the current density in the reduced area.

The major result of the above described crowding of emitter current into the reduced area is believed to be that the charge density contribution of such emitter current will become greater than the charge density of the ionized impurities (i.e., the background doping concentration) in the collector region through which the injected emitter current must pass. This causes an increase in the electric field strength near the collector NN+ junction. If this critical electric field strength ($E_{cr}$) is exceeded, the transistor usually will be destroyed.

In order to avoid destruction of power transistors due to the occurrence of the above described second breakdown, it is common to provide "safe operating area" (SOA) curves for power transistors to enable the user to operate them in such a manner that it can be assured that secondary breakdown will not occur (assuming absence of long term damage such as that described in the above mentioned Gaur reference). Such SOA curves can then be used with confidence by circuit designers to select transistors having sufficiently high power dissipation and secondary breakdown characteristics that destruction of the transistors will not occur for the specified operating modes of the power transistor.

Figure 2:
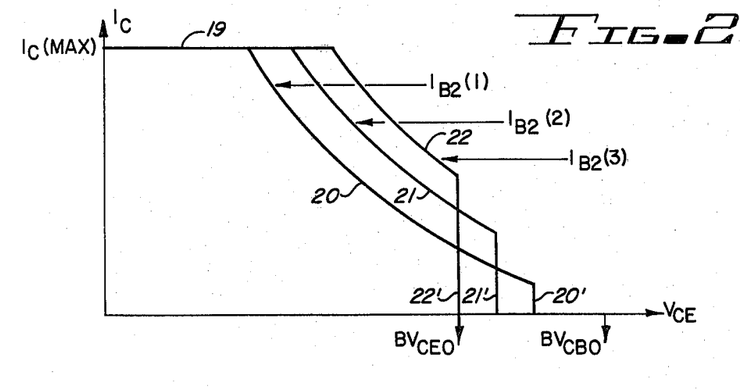
FIG. 2 is a graph useful in explaining the concepts of secondary breakdown and safe operating area for a power transistor.

FIG. 2 discloses a typical safe operating area curve for a power transistor. Referring now to FIG. 2, the illustrated safe operating area curve includes an $I_C$ (collector current) axis and a $V_{CE}$ (collector-to-emitter voltage) axis. The maximum collector current which is permitted in the power transistor is $I_{C(MAX)}$. The maximum voltage which can be applied to the collector is $BV_{CBO}$. The safe operating area is the area bounded by line 19 (which is designated the maximum collector current $I_{C(MAX)}$, the $V_{CE}$ axis, one of the curves 20, 21, or 22 (depending upon whether the turn-off base current being applied to the power transistor is $I_{B2(1)}$, $I_{B2(2)}$, or $I_{B2(3)}$, where $$I_{B2(1)} > I_{B2(2)} > I_{B2(3)}$$

and a corresponding one of curves 20', 21', and 22'. Thus, the power transistor must be operated so that the collector voltage is substantially less than $BV_{CBO}$. Also, for a particular level of turn-off base current, the transistor must be operated at reduced levels of collector current $I_C$ as the collector-to-emitter voltage $V_{CE}$ is increased.

Figure 3A:
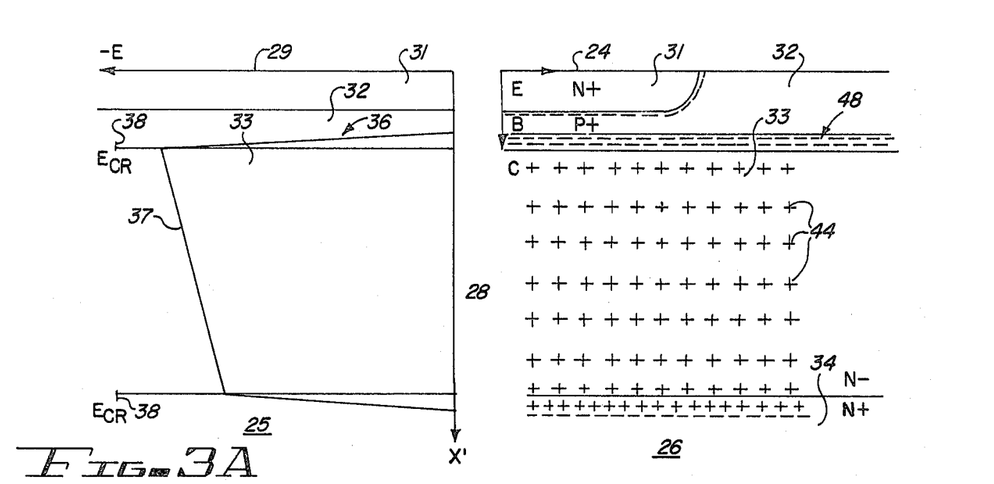
FIGS. 3A and 3B are diagrams useful in explaining the distribution of charges and electric field intensity in a transistor during turning on of the transistor.
Figure 3B:
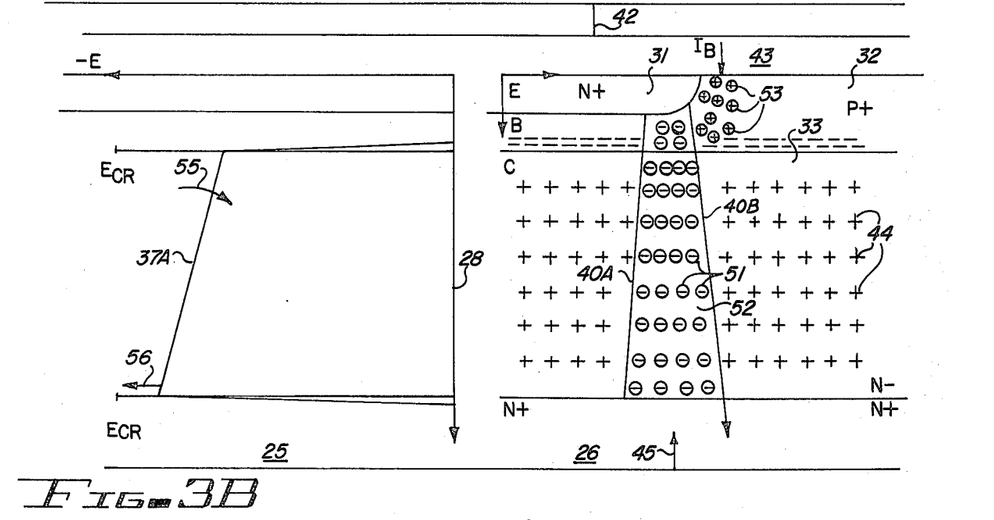

In order to understand the present invention, it is helpful to refer to FIGS. 3A-3B in explaining operation of and the internal conditions present in transistor 2 of FIG. 1 during turning on of transistor 2. It is also helpful to refer to FIGS. 4 and 5A-5D to explain the operation of and internal conditions in transistor 2 during turning off of transistor 2.

Referring now to FIG. 3A, FIG. 3A includes structure 26 which illustrates a sectional view showing the distribution of charges in an NPN transistor which is "cut off". The NPN transistor includes an N+ emitter region 31, a P-type base region 32, an N-type collector region 33, and an N+ type substrate layer 34. Ionized charges in the base region are represented by minus (−) symbols 48, while reference numerals 47 and 49 represent ionized donors in the collector region 33 and the N+ substrate region 34. Transistor structure 26 is disposed so that Y axis 29 lies horizontally along the upper surface of the structure in FIG. 3A, and X axis 28 extends downward into the illustrated semiconductor structure.

FIG. 3A also includes graph 25 which illustrates the electric field intensity distribution in the X direction in transistor structure 26. Graph 25 and structure 26 are collectively referred to as a field-structure diagram. Graph 25 shows the electric field −E plotted along horizontal axis 27 as a function of X, the above mentioned distance into transistor structure 26. The electric field intensity curve 36 includes a section 37 in collector region 33. The slope of section 37 is due to the distribution of ionized donors 47 in transistor structure 26 when the transistor is in the "off" condition. The previously mentioned critical field strength ($E_{cr}$) at which avalanche injection due to impact ionization occurs is indicated by reference numeral 38.

FIG. 3B illustrates the configuration of graph 25 and structure 26 after the transistor begins to turn on due to forcing of turn-on current $I_B$ (indicated by arrow 43) into the base of the transistor. Base current $I_B$ produces holes 53 in base region, some of which holes drift across the emitterbase junction, causing injection of minority carrier electrons 51 into base region 32. Most of the injected electrons 51 diffuse through base region 32 and drift across the collector region 33. This modifies the charge distribution within the volume 52 bounded by lines 40A and 40B, causing the electric field in that region to be modified. More particularly, it should be noted that the slope of electric field curve 37A of graph 25 in FIG. 3B has been modified; i.e., segment 37A of electric field curve 36 has rotated in the direction indicated by arrow 55. This causes the electric field intensity near the NN+ junction to be increased near to critical electric field $E_{cr}$, as indicated by arrow 56. Conductivity modulation in the collector region caused by the emitter current increases the field intensity. Those skilled in the art will recognize that as the current density increases in the volume 52 segment 37A of electric field curve tends to rotate in the clockwise direction, increasing the electric field intensity at the NN+ junction.

Figure 5A:
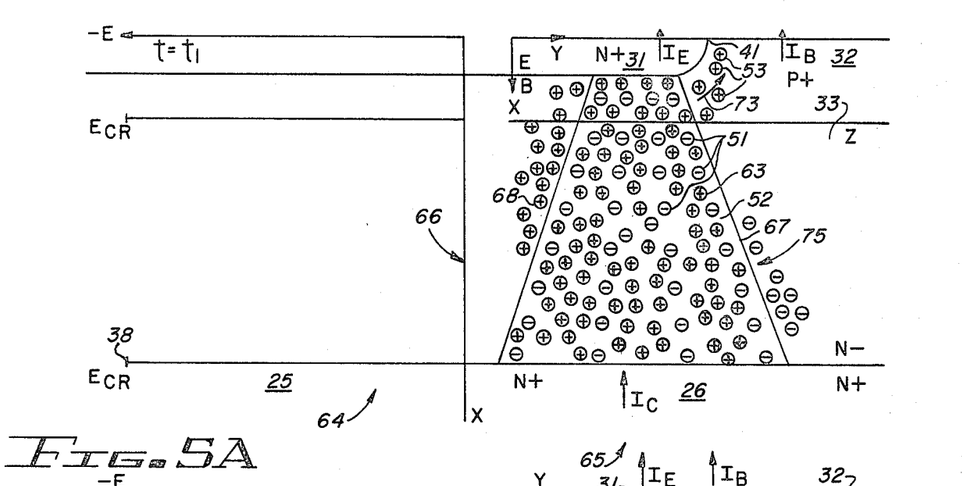
FIGS. 5A–5D are diagrams useful in explaining the charge distribution and electric field distribution in a power transistor during various portions of the turn-off operation of the power transistor whose terminal waveforms are shown in FIG. 4.

As the base current $I_B$ continues to flow, and as the transistor of structure 26 in FIGS. 3A and 3B becomes saturated, the charge distribution in the collector and base region will assume the configuration shown in FIG. 5A, at which point the entire collector region portion bounded by lines 67 and 68 is conductivity modulated, producing a situation wherein the electric field intensity approaches zero in the X direction. At this point, most of the emitter current is injected near the periphery 41 of the emitter region.

Figure 4:
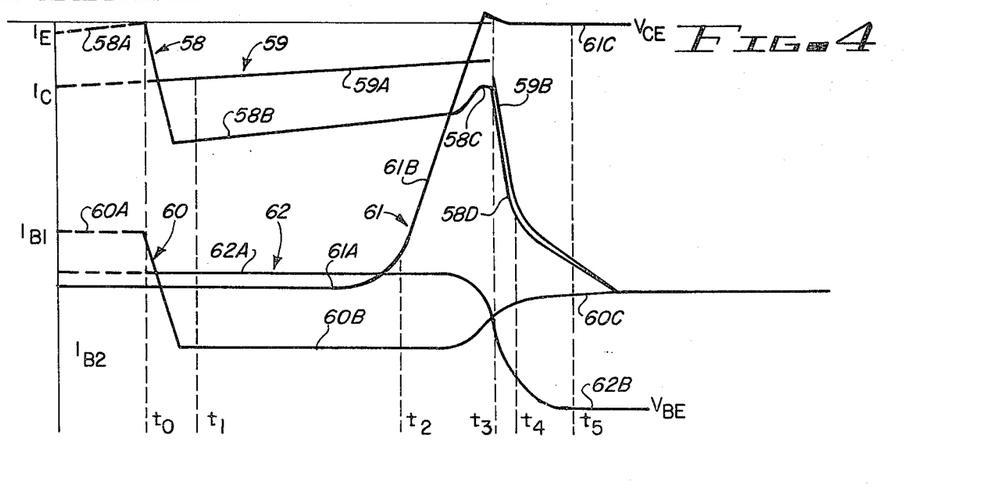
FIG. 4 is a graph illustrating the terminal waveforms of a power transistor during turning off of a saturated power transistor.

Referring now to FIG. 4, the transistor is turned off by reversing the direction of base current $I_B$ from the level represented by reference numeral 60A to the level represented by reference numeral 60B. Reference numeral 60B represents a turn-off current withdrawn from the base region to effect turning off of the transistor. As a result of the reversal of the direction of the base current from level 60A to level 60B, the emitter current $I_E$ simultaneously falls to the level indicated by reference numeral 58B. However, as will be subsequently explained, injection of current from emitter region 31 continues to occur from the initiation of the turn-off procedure at time $t_o$ in FIG. 4 until approximately time $t_5$. The base-to-emitter voltage $V_{BE}$ and collector-to-emitter voltage $V_{CE}$ waveforms during the transistor turn-off operation are designated by curves 62 and 61, respectively, in FIG. 4.

Referring now to FIG. 5A, the transistor is saturated at the beginning of the turn-off operation, and the volume 52 bounded by lines 67 and 68 is heavily conductivity modulated, and the electric field intensity 66 in graph 25 has a value approaching zero in the volume 52. The turn-off base current $I_B$ is drawn out of base region 32. The holes forming $I_B$ in the base region 32 flow along the emitter base junction, as indicated by arrow 73. Thus, the charge distribution and electric field intensity shown in FIG. 5A illustrate that the base and collector regions are still heavily conductivity modulated at the time $t=t_1$ in FIG. 4 immediately after the turn-off operation is initiated, as injection of electrons from emitter region 31 into base region 32 continues during the ensuing period of time, despite the above mentioned reversal of base current. The flow of majority carriers along the path indicated by arrow 73 causes a voltage drop along the emitterbase junction, causing the region 52 of conductivity modulation bounded by lines 67 and 68 to shift to the left, as indicated by arrow 75.

Figure 5B:
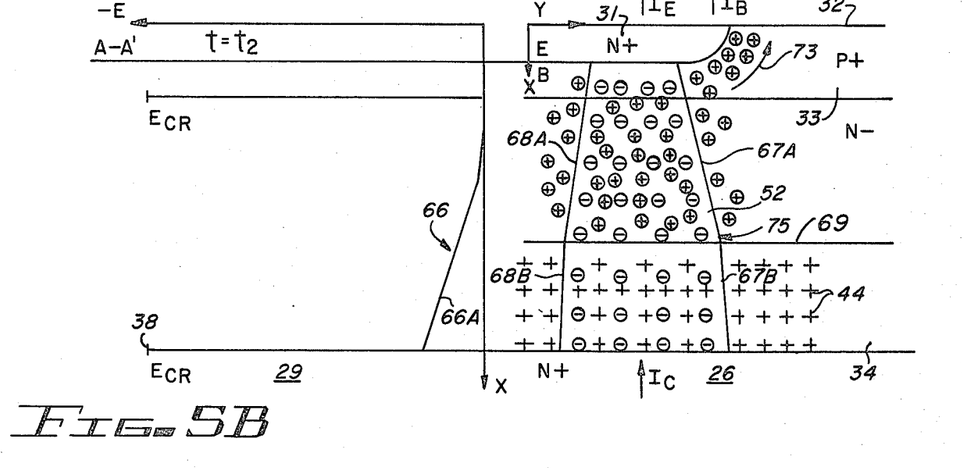

Reffering now to the diagram of FIG. 5B, it can be seen that the collector region 33 is only partially conductivity modulated, as depletion front 69 moves from the NN+ junction toward base region 32. The portion of volume 52 of the collector between the base collector junction and depletion front 69 remains conductivity modulated, and the electric field therein remains very low, as shown in graph 25. However, the portion of volume 52 bounded by lines 68B and 67B, depletion front 69 and the NN+ junction is no longer highly conductivity modulated, and the electric field distribution therein increases, as indicated by segment 66A of electric field curve 66 in the field diagram 25 of FIG. 5B. At this point, the high density electronic charge overwhelms the background ionized impurity charge 44, resulting in the indicated slope of the lines 66A.

Figure 5C:
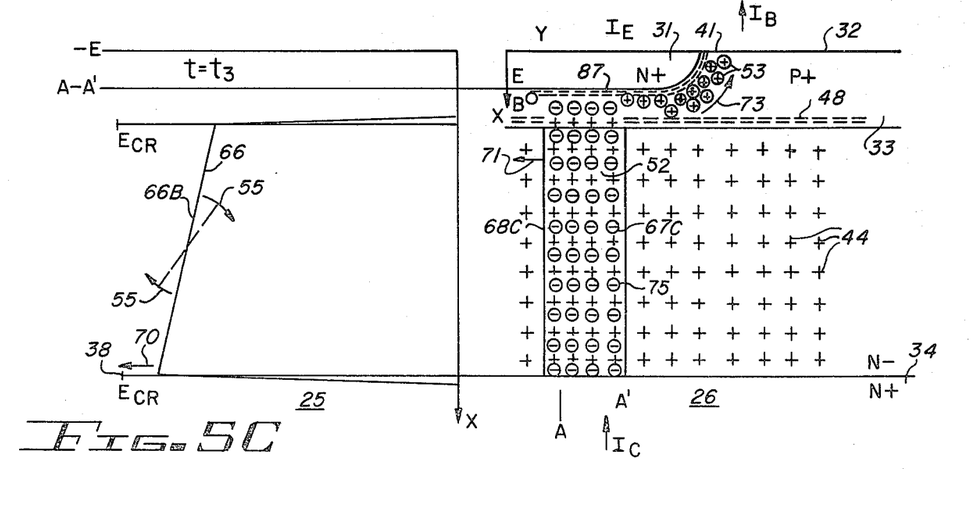

At time $t=t_3$, the field and structure diagram appears as shown in FIG. 5C. At this point in time the collector voltage $V_{CE}$ of the transistor has reached its limiting value, as shown in FIG. 4, and the collector region is entirely depleted. The collector region volume 52 bounded by lines 67C and 68C now form a "filament" which is moved a considerable distance to the left under the emitter region 31 as a result of voltage drop in base region 32 along the emitter-base junction due to flow of carriers forming the turn-off current $I_B$.

The hole current in the base region is due to both holes which have not recombined and depletion charge generation which occurs as depletion regions spread into the base as $V_{CE}$ (and hence $V_{CB}$) increases. Meanwhile, other sections of the transistors which are remote from an emitter bonding pad (subsequently described) are becoming reversed biased, causing the volume or "filament" 52 bounded by lines 67C and 68C to conduct an increased amount of current. This increases the current density in the filament, causing segment 66B of electric field curve 66 to rotate in the direction indicated by arrows 55. Note that electric field curve 66 represents the electric field distribution in the volume 52 as a function of X. If line 66B rotates sufficiently, the critical electric field $E_{cr}$ at point 38 can be exceeded. If this happens, avalanche injection occurs, and the transistor is destroyed. The decreasing of the cross-sectional area of volume 52 because of the lateral voltage drop in base region 32 and the resulting decreasing of the amount of reverse biased emitter-base junction area is referred to herein as "emitter current restriction".

By time $t=t_4$, the collector current has fallen off sharply, as shown in FIG. 4. Since the collector voltage is no longer changing, depletion charge generation ceases. Therefore the amount of charge which is available for contributing to continuation of transistor action is very small. As long as the emitter current does not decrease at a slower rate than the area within the above mentioned filament, a charge distribution within the filament will not be altered sufficiently to cause the line 66C (FIG. 5D) to rotate sufficiently clockwise that the critical field $E_{cr}$ will be exceeded at the NN+ junction as indicated by arrows 55.

Figure 5D:
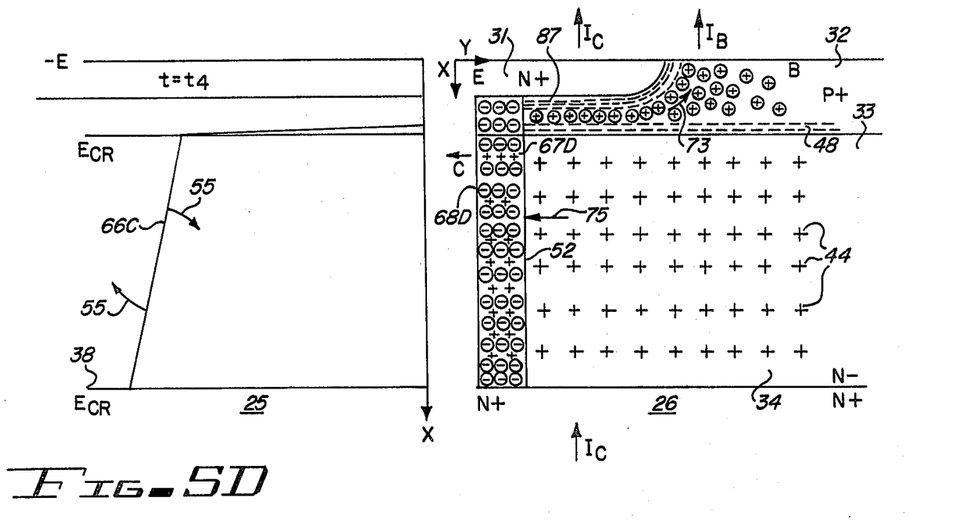

Referring now to FIGS. 5C and 5D, which correspond to the electric field and charge distributions in the transistor at times $t=t_3$ and $t=t_4$, respectively, it is seen that filament or volume 52 continues to move to the left, as indicated by arrow 75. It should be realized that as this occurs in other parts of the same transistor, other portions (not shown) of the emitter-base junction are also being reverse biased, or cut off. Yet it is seen (from FIG. 4) that until at least time $t_3$, the emitter current $I_E$ remains approximately constant. As a result, the emitter current density in volume or filament 52 can increase quite sharply, causing rotation of segment 66B of electric field intensity curve 66 in the direction indicated by arrows 55, causing the lower end of segment 66B to move toward the critical voltage $E_{cr}$, as indicated by arrow 70. By comparing the relative locations of boundary line 67A in FIG. 5B and 67D in FIG. 5D, it can be seen that conducting volume or filament 52 is moved substantially to the left during the turn-off process occurring from $t_0$ to $t_4$. This, as previously explained, occurs due to the voltage drop caused by flow holes constituting base turn-off current $I_B$, as indicated by arrow 73.

It can be seen from the $V_{CE}$ waveform 61 in FIG. 4 that the collector voltage does not start increasing very substantially until time $t_2$. However, once $V_{CE}$ does start increasing rapidly, this causes an extending of the depletion layer into base region 32 adjacent the P+N− boundary. Reference numerals 87 and 48 in FIGS. 5C and 5D illustrate the expanding depletion layers in the base region during the portion of turn-off operation between time $t_2$ and $t_3$. This tends to "pinch off" a substantial portion of the base region from conducting holes 53, greatly increasing the lateral base resistance, and thereby further increasing the lateral voltage drop in base region 32. Consequently, the rate of emitter current constriction is substantially increased during the period from $t_2$ to $t_3$. This, in turn, increases the likelihood of occurrence of secondary breakdown in the transistor during that period.

It is to be emphasized that the electric field configurations and charge distributions shown in FIGS. 5A–5D illustrating turn-off of a transistor are shown only for the purpose of explaining the general current constriction phenomena which is believed to give rise to secondary breakdown during turn-off of transistors. These curves do not describe the desired operation of transistor 2 in FIG. 1 during turn-off. It has been discovered that in order to reliably avoid secondary breakdown during turn-off, it is necessary to have completely reverse biased the entire emitter-base junction before the collector voltage of transistor 2 of FIG. 1 begins to rise rapidly, i.e., before a time corresponding to time $t_2$ in FIG. 4. It is also necessary that the base turn-off current $I_B$ be sufficiently large after time $t_2$ to prevent any portion of the emitter-base junction from subsequently becoming forward biased due to depletion charge created as the collector voltage rises toward a maximum positive voltage In accordance with the present invention, the circuit in FIG. 1 is operated such that the turn-off base current $I_B$ has a sufficient magnitude to reverse biase the entire emitter-base junction by approximately time $t_2$ of FIG. 4, the time at which the collector-to-emitter voltage $V_{CE}$ begins rising rapidly. As $V_{CE}$ rises rapidly, a substantial amount of depletion charge is created. This depletion charge produces an additional current component which must be supplied through the collector electrode of the transistor and must be conducted out of the base region by the base turn-off current. This increases the lateral resistive voltage drop in the increasingly narrowed conductive (undepleted) portion of the base region. If such voltage drop becomes sufficiently large that any portion of the emitter-base junction again becomes forward biased, the resulting emitter injection will most likely cause a sufficient amount of rotation of the electric field curve to cause $E_{CR}$ to be exceeded, especially since the electric field in the collector region is already quite high due to the fact that $V_C$ has been increasing rapidly. (Remember that the area bounded by the electric field curves shown in FIGS. 5A–5D is analogous to the collector voltage of the transistor.) It should be noted that if the base turn-off current $I_B$ has a magnitude greater than or equal to the collector current $I_C$ during the time period that $V_{CE}$ is rapidly increasing, this will help to ensure that the emitterbase junction will not become forward biased at any point. It should be noted that if no emitter injection occurs between time $t_2$ and $t_5$, the electric field line in the collector region will have the slope indicated by reference numeral 37 in FIG. 3A and no breakdown will occur until the upper portion of the electric field curve in the collector reaches $E_{cr}$ at the collector-base junction; the collector voltage at which this will happen is $BV_{CBO}$, which is much higher than the secondary breakdown voltages of power transistors.

Figure 6:
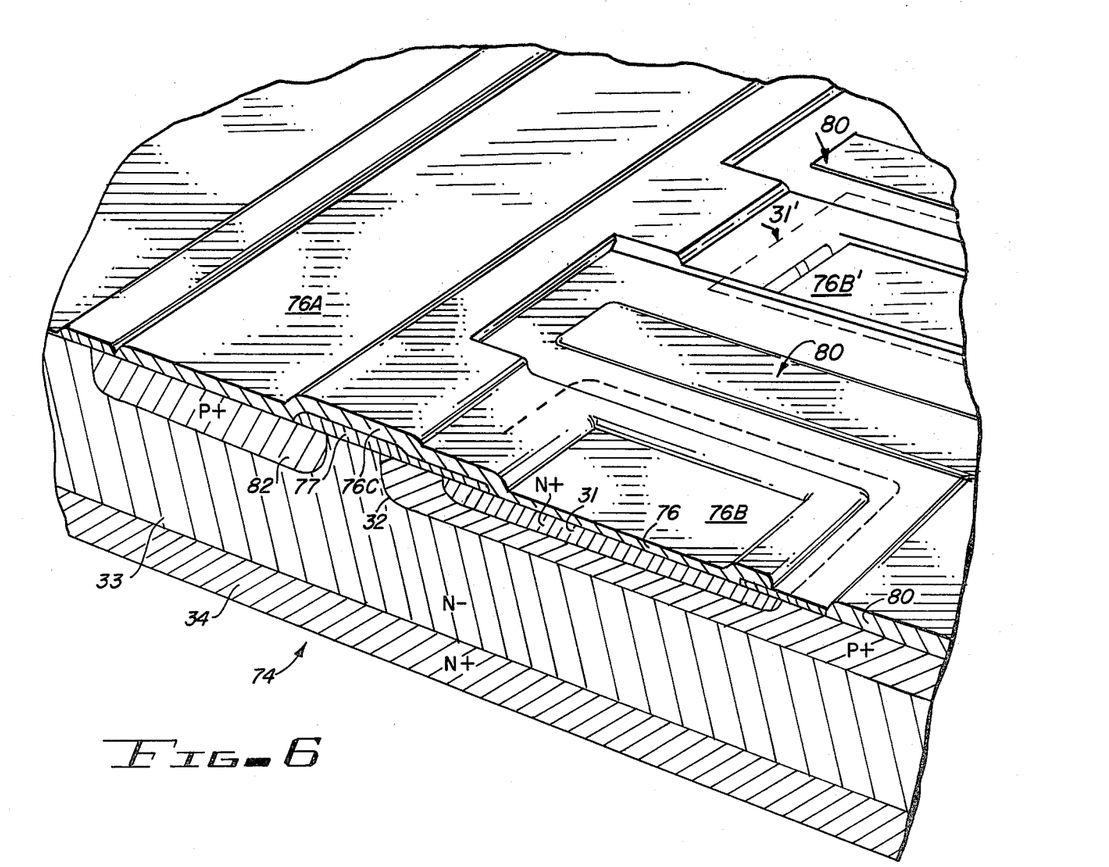
FIG. 6 is a partial sectional perspective view of transistor 2 of FIG. 1.
Figure 7:
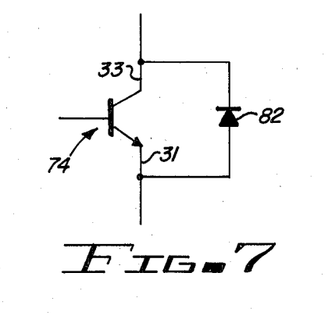
FIG. 7 is a schematic diagram useful in explaining the operation of the transistor of FIG. 6.

FIGS. 6, 7, 8A and 8B illustrate improved transistor structures which incorporate the present invention and are useful in practicing the method of the present invention. Referring first to FIGS. 6 and 7, the structure of transistor 2 includes an N+ substrate 34. An N− collector region 33 is contiguous with the upper surface of substrate 34. A P-type base region 32 is disposed in collector region 33, as illustrated. An N+ emitter region 31 is disposed within base region 32. The upper surfaces of collector region 33, base region 32, and emitter region 31 are substantially co-planar. A metal layer 76, referred to as the emitter metal, electrically contacts emitter region 31 through an opening in oxide layer 77, which prevents emitter metal layer 76 from contacting base region 32 and collector 33. The thickness of the layers in FIG. 6 and the impurity concentrations thereof will vary depending on the desired current levels and breakdown voltage levels, but can be readily determined by those skilled in the art.

Metal layer 80, referred to as base metal 80, extends through another opening in oxide layer 77 to contact P-type base region 32. In accordance with the conventional well known manner of making power transistors, the surface geometry of power transistor 2 (which is only partially shown in FIG. 6) includes a plurality of interdigitated finger-like base end emitter regions and corresponding metal contacting layers in order to provide low base resistance and high peripheral emitter length.

The structure of FIG. 6 includes a section 76A of the emitter metal layer 76. Metal layer 76A is referred to as the emitter bonding pad, since a wire is attached or bonded to metal layer 76A in a completed transistor device. Emitter bonding pad 76A is attached to emitter contacting portion 76B of emitter metal layer 76 by means of portion 76C which extends over oxide layer 77.

In accordance with the present invention, emitter bonding area 76A contacts a second separate P-type diffused region 82 disposed in collector region 33, rather than an extending portion of emitter region 31, as is commonly done in prior art structures. The shown structure has the advantage of eliminating a large amount of emitter area (i.e., that extension of the emitter on which the emitter bonding pad is disposed in prior art devices) which has a relatively low peripheral length (and therefore low efficiency), and is relatively remote from the nearest base contact region, and therefore has a rather high tendency to contribute to secondary breakdown. This is due to the fact that the turn-off base current described produces relatively large voltage drops between the base contact region and the relatively remote portions of the emitter area, including those portions beneath prior art emitter bonding pad structures. The emitter current consequently is "constricted" to such remote portions of the emitter and is therefore the last portion of the emitter-base junction to be biased off during the turn-off operation, and therefore this is where secondary breakdown usually occurs in the prior art power transistor structures.

Figure 8A:
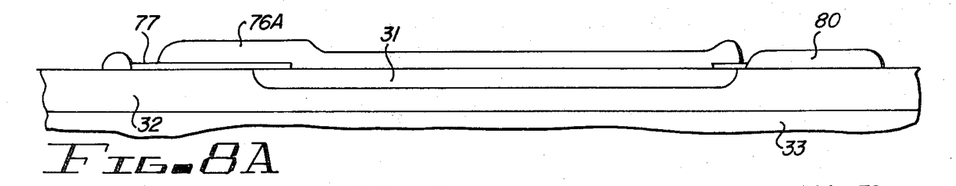

Referring to FIG. 8A, an alternate structure is shown wherein an oxide layer 77 extends beneath emitter bonding pad 76A to prevent it from being shorted to base region 32. However, this structure has a disadvantage that emitter bonding pad 76A is disposed over oxide layer 77, whereas the base metal 80 is not. This can present wire bonding problems due to the difference in bonding characteristics for the two types of underlying material.

Figure 8B:
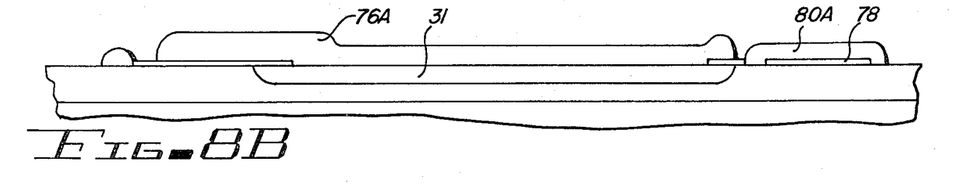

Another alternate structure shown in FIG. 8B, wherein the base metal layer 80 includes a base bonding pad 80A which extends over oxide layer 78 of the same thickness as oxide layer 77, thereby avoiding wire bonding difficulties due to characteristic bonding differences mentioned above.

It should be noted that the P-type region 32 of FIG. 6 effectively adds a diode in parallel with the transistor, as shown in FIG. 7, wherein the anode is connected to the emitter of the transistor and the cathode is connected to the collector of the transistor. The presence of this diode has no undesirable effect on operation, and in fact, may reduce the likelihood of the occurrence of second breakdown by a capacitively accepting charge from the collector region during the turn-off operation.

While the invention has been described with reference to several embodiments thereof, it will be recognized that variations in the described structure and method may readily be made within the spirit and scope of the invention. For example, the base turn-off current can be of a relatively low magnitude until the stored charge in the base and collector regions of a saturated transistor is withdrawn to reverse bias the entire emitter-base junction. The magnitude of the base turn-off current then can be increased to at least equal the magnitude of the collector current during the period of time (i.e., from $t_2$ to $t_3$ in FIG. 4) during which $V_{CE}$ is rapidly increasing in magnitude, in order to prevent re-forward biasing of any portion of the emitter-base junction. It will be appreciated that this method of operation results in lower average power dissipation in the power transistor than is the case in which the base turn-off current is as large as the collector current while the stored charge is being withdrawn from the base and collector regions during the time from $t_1$ to $t_2$ in FIG. 4.

It should be noted that it is not necessary that the emitter of transistor 2 in FIG. 1 be connected to a ground voltage, nor is it necessary that the turn-off circuit have the configuration of circuit 12 in FIG. 1. For example, the desired operation of transistor 2 can be alternatively accomplished by connecting the base of transistor 2 only to one terminal of a resistor (such as resistor 9 in FIG. 1), the resistor having its other terminal connected to a positive supply voltage, e.g. +5 volts. A diode having its anode connected to the base of transistor 2 can be connected in parallel with the resistor. The emitter of transistor 2 can be connected to the collector of a second transistor (which can be an ordinary low cost switching transistor) having its emitter connected to ground, and having its base driven by a suitable logic circuit. When the second transistor is on, transistor 2 is clearly turned on, and an appropriate base current is supplied through the resistor. When the second transistor is turned off, its collector voltage rises to nearly +5 volts, and transistor 2 begins to turn off in the manner previously described herein. The diode prevents the base of transistor 2 from rising substantially above +5 volts. The emitter current of transistor 2 will be essentially zero and the current through the diode will first discharge charge stored in the base and collector regions, and will then discharge the depletion charge produced as the collector voltage of transistor 2 rises rapidly past the secondary breakdown voltage of transistor 2. The considerations previously described herein with reference to FIGS. 4 and 5A–5D must be met in order to avoid secondary breakdown in transistor 2 during the operation of turning off of transistor 2 by means of the alternative circuit described immediately above wherein the parallel connected resistor and diode perform the function of a turn-off circuit.

I claim:

1. A method of operating a power transistor circuit to avoid secondary breakdown in a power transistor included in said power transistor circuit, said power transistor having base, collector, and emitter terminals, said power transistor having a secondary breakdown which is less than the $BV_{CBO}$ voltage of said power transistor, said power transistor circuit including a load element for supplying collector current to said collector terminal, said method comprising the steps of:
 (a) turning said power transistor on by conducting a first current into said base terminal, said first current being sufficiently large to cause a collector current to flow in said collector terminal and to cause said power transistor to become saturated;
 (b) turning said power transistor off by
   (i) conducting a first base turn-off current out of said base terminal to remove charge stored in the base and collector regions of said power transistor, said first base turn-off current being substantially less than said collector current, and
   (ii) conducting a second base turn-off current out of said base terminal, said second base turn-off current being at least equal to said collector current, said second base turn-off current being conducted out of said base terminal only after a substantial amount of said charge in said base and collector regions has been removed by said first base turn-off current.

* * * * *